(12) United States Patent
Takei et al.

(10) Patent No.: US 6,692,999 B2
(45) Date of Patent: Feb. 17, 2004

(54) POLYSILICON FILM FORMING METHOD

(75) Inventors: Michiko Takei, Kawasaki (JP); Akito Hara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/037,492

(22) Filed: Jan. 3, 2002

(65) Prior Publication Data
US 2003/0017659 A1 Jan. 23, 2003

(30) Foreign Application Priority Data
Jun. 26, 2001 (JP) ........................................ 2001-192909

(51) Int. Cl.⁷ ........................... H01L 21/00; H01L 21/84
(52) U.S. Cl. ..................... 438/166; 438/487; 438/149
(58) Field of Search ............................. 438/166, 487, 438/FOR 484, 201, 269, 149–165

(56) References Cited

U.S. PATENT DOCUMENTS

| | | | | |
|---|---|---|---|---|
| 4,059,461 A | * | 11/1977 | Fan et al. | 438/92 |
| 4,959,700 A | * | 9/1990 | Yamazaki | 257/61 |
| 5,569,610 A | * | 10/1996 | Zhang et al. | 438/166 |
| 5,712,191 A | * | 1/1998 | Nakajima et al. | 438/487 |
| 5,824,574 A | * | 10/1998 | Yamazaki et al. | 438/150 |
| 5,937,282 A | * | 8/1999 | Nakajima et al. | 438/149 |
| 5,953,597 A | | 9/1999 | Kusumoto et al. | |
| 6,204,099 B1 | | 3/2001 | Kusumoto et al. | |
| 6,246,070 B1 | * | 6/2001 | Yamazaki et al. | 257/40 |
| 6,329,229 B1 | * | 12/2001 | Yamazaki et al. | 438/166 |
| 2002/0058365 A1 | * | 5/2002 | Lee et al. | 438/166 |

FOREIGN PATENT DOCUMENTS

JP 8-228006 9/1996

* cited by examiner

*Primary Examiner*—John F. Niebling
*Assistant Examiner*—Jennifer M. Kennedy
(74) *Attorney, Agent, or Firm*—Greer, Burns & Crain, Ltd.

(57) ABSTRACT

There is provided the step of forming a polysilicon film by scanning a laser irradiation region while irradiating a continuous wave laser onto an amorphous silicon film formed into an island or ribbon-like shape on a substrate. If a width of a rectangle in which the amorphous silicon film is inscribed is 30 μm or less, any one condition of (1) a top end shape of a pattern is a convex shape, (2) a top end shape is a concave shape and consists of straight lines and has three corner portions at a top end side, and both angles of the corner portions on both sides of the top end shape are set to 45 degree or more, (3) a top end shape is a concave shape and consists of curved lines, and (4) a width of a top end portion is 25 μm or less, is satisfied.

6 Claims, 18 Drawing Sheets

FIG. 1
→ Laser Scanning Direction
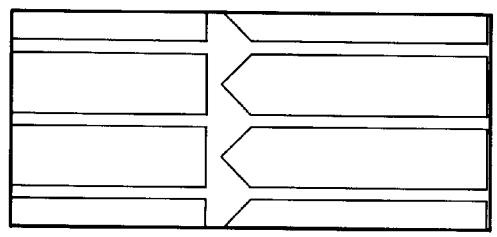
A1
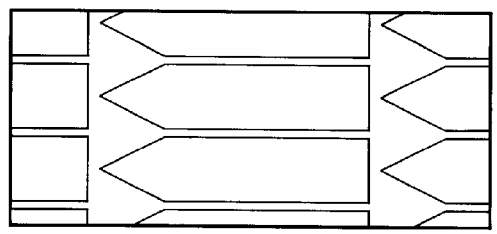
B1
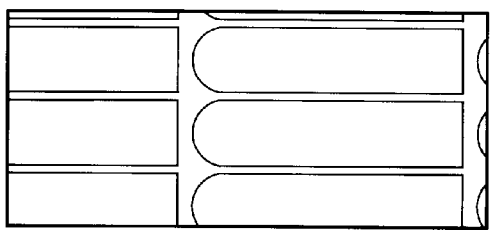
C1
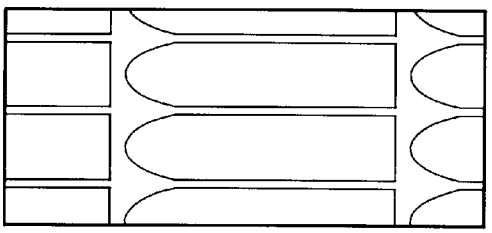
D1

FIG. 2
Laser Scanning Direction →
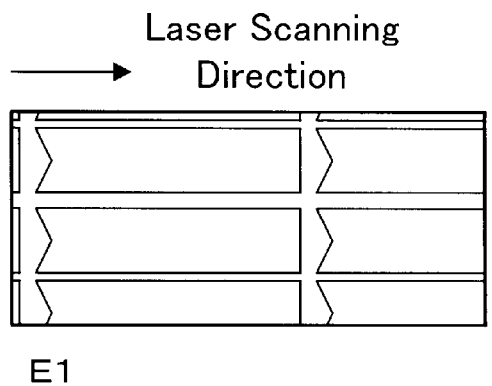
E1
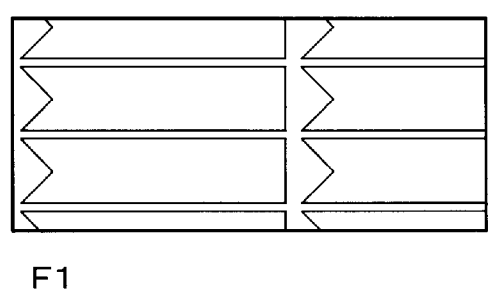
F1
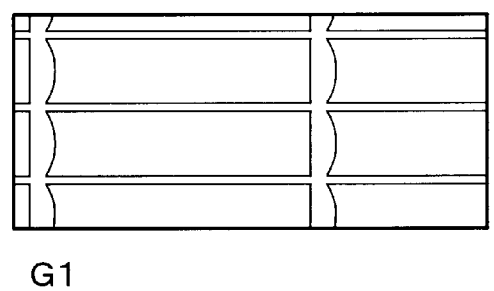
G1
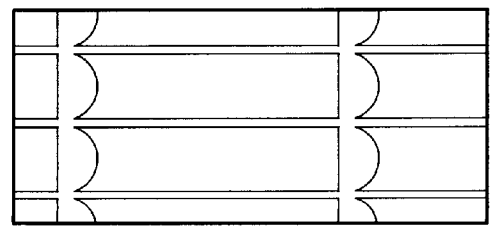
H1

FIG. 3
→ Laser Scanning Direction
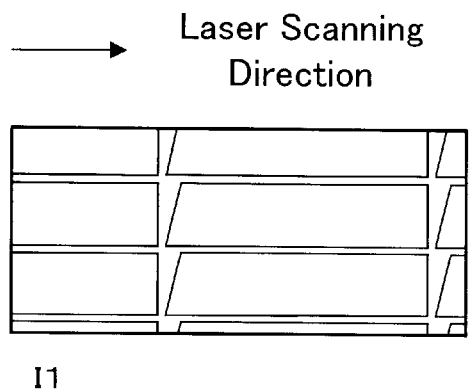
I1
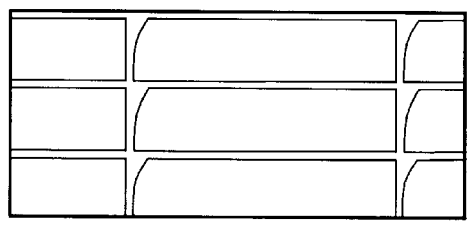
J1
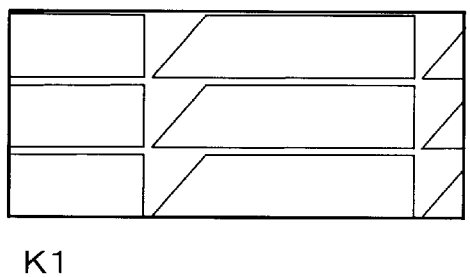
K1
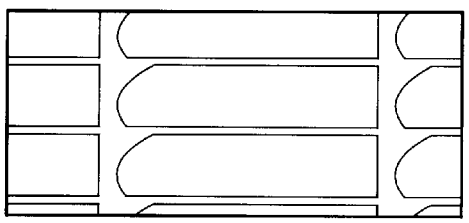
L1

FIG. 4
→ Laser Scanning Direction
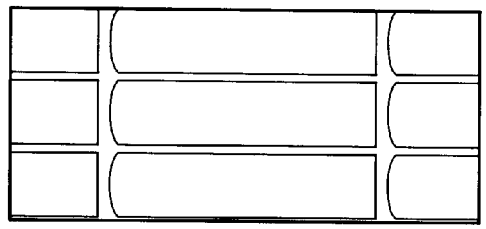
M1
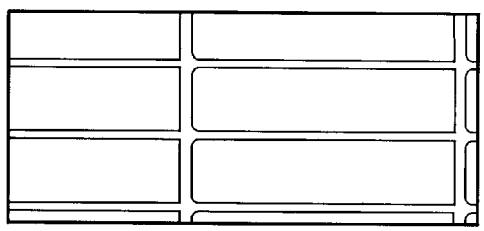
N1
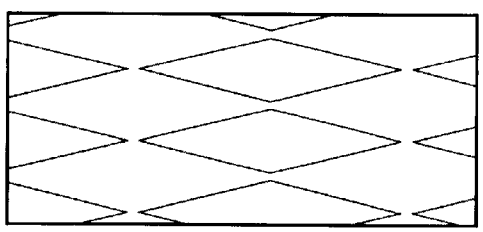
O1
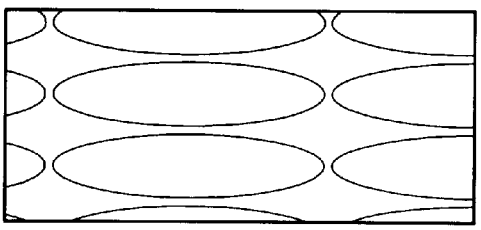
P1

FIG. 5
→ Laser Scanning Direction
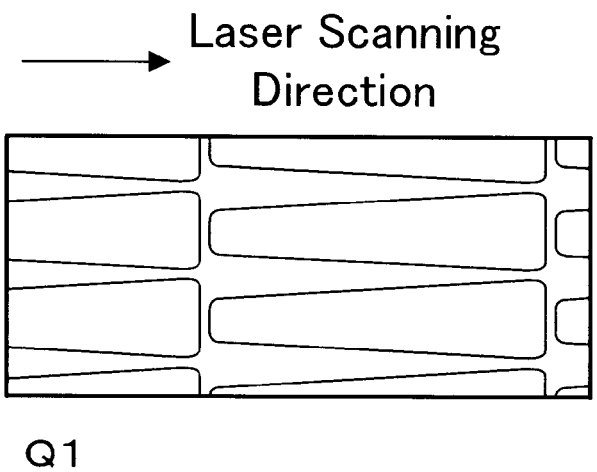
Q1
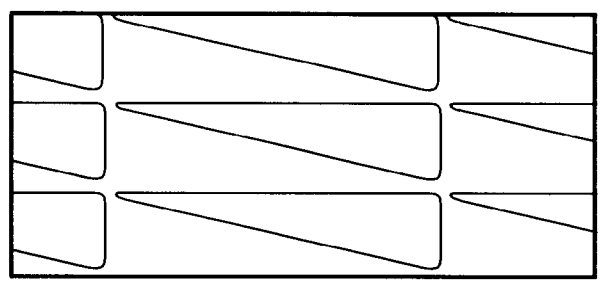
R1
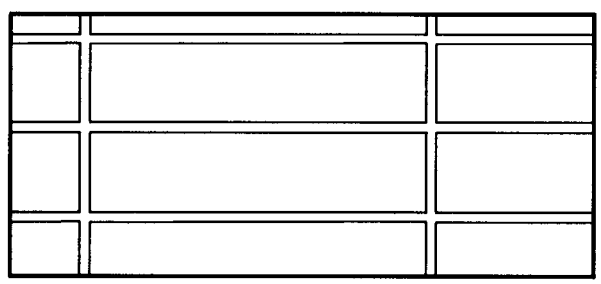
V1

Before Etching

Residue Remains After Etching

POLYSILICON FILM FORMING METHOD

CROSS-REFERENCE TO RELATED APPLICATIONS

This application is based upon and claims priority of Japanese Patent Application No. 2001-192909, filed in Jun. 26, 2001, the contents being incorporated herein by reference.

BACKGROUND OF THE INVENTION

1. Field of the Invention

The present invention relates to a method of forming a polysilicon film employed in manufacturing a liquid crystal display device, an organic EL (Electroluminescence) display device, etc.

2. Description of the Prior Art

The liquid crystal display device has advantages such that the device is thin and lightweight, can be driven by low voltage and has small power consumption, and is widely employed in various electronic devices. In particular, since the active matrix liquid crystal display device in which the TFTs (Thin Film Transistors) are provided every pixel is excellent in the display quality that such device is equivalent to the CRT (Cathode-Ray Tube), such device is employed in the display of the TV, the personal computer, etc.

In recent years, in the liquid crystal display device, the polysilicon is employed as the operation layer of the TFT. Since the polysilicon has the higher carrier mobility than the amorphous silicon, not only the high-speed operation of the element can be achieved but also the element size can be reduced. Thus, the higher definition of the liquid crystal display device can be attained. Also, since the driver circuits such as the data driver, the gate driver, etc. can be constructed by the TFTs, the driver circuits and the display portion can be integrated on the same substrate. Accordingly, the reduction in the number of steps and the reduction in the number of parts can be achieved, so that a production cost of the liquid crystal display device can be reduced and also the reliability can be improved.

In the prior art, the polysilicon film is formed by the method described in the following. That is, first the amorphous silicon film is formed on the glass substrate by the plasma CVD method. Then, while irradiating the pulse laser beam output from the excimer laser onto the amorphous silicon film, the laser irradiation region is moved (scanned) in one direction. In doing so, the amorphous silicon film is fused by the laser irradiation and then crystallized on the portion located on the outside of the laser irradiation region to produce the polysilicon. In this manner, the polysilicon film is formed on the substrate.

However, in the polysilicon film formed by the above method, the grain size of the silicon crystal is relatively small. The carrier mobility of the polysilicon film depends largely on the grain size of the silicon crystal. If the grain size of the crystal is small, the carrier mobility is also small. Also, in the polysilicon film formed by the method in the prior art, the grain size of the crystal is largely varied, so that variation of the transistor characteristics is increased.

SUMMARY OF THE INVENTION

It is an object of the present invention to provide a polysilicon film forming method capable of manufacturing a TFT that permits a high-speed operation and has small variation in the characteristics.

If the laser irradiation region is scanned while irradiating the continuous wave laser (CW laser) onto the amorphous silicon film, the silicon crystal that is 10 to 100 times larger than the silicon crystal generated by the excimer laser can be formed. However, if it is tried to form the polysilicon film on the overall surface of the glass substrate having the size that is employed in manufacturing the liquid crystal display panel, failures such as peeling and others are generated because of unstable factors (the impurity, the tension, etc.) of the film.

If the amorphous silicon film is formed on the substrate, then the amorphous silicon film is formed into a plurality of island or ribbon-like shapes by etching the amorphous silicon film by the photolithography method, and then the laser irradiation region is scanned while irradiating the CW laser onto respective amorphous silicon films, the polysilicon film made of the silicon crystal having the large grain size can be formed while avoiding the temperature rise of the substrate.

However, according to the experiment made by the inventors of the present invention, it is found that, if it is tried to form the polysilicon film into the island or ribbon-like shapes by this method, peeling is ready to occur when the patterns of the silicon film are formed densely. Actually, if the driver circuit of the display device is formed by the TFT, the polysilicon film must be formed in the dense state.

Therefore, the inventors of the present invention examined the degree of peelings of the polysilicon film by changing variously the shape of the amorphous silicon film. As a result, it is found that the degree of peelings is largely changed depending on the shape of the amorphous silicon film. The present invention was made based on such experimental results.

In other words, in the present invention, if a width of the island or ribbon-like amorphous silicon film (a width of a rectangle in which the pattern of the amorphous silicon film is inscribed: which is similar hereinafter) before the CW laser irradiation is 30 μm or less, a shape is formed to satisfy any one condition of (1) a top end shape of a pattern (a top end in irradiating the laser: which is similar hereinafter) is a convex shape, (2) a top end shape is a concave shape and consists of straight lines and has three corner portions at a top end side, and both angles of the corner portions on both sides of the top end shape are set to 45 degree or more, (3) a top end shape is a concave shape and consists of curved lines, and (4) a width of a top end portion is 25 μm or less.

Also, if a width of the island or ribbon-like amorphous silicon film before the CW laser irradiation is in excess of 30 μm, a shape is formed to satisfy any one condition of (1) a top end shape of a pattern is a convex shape and consists of straight lines, (2) a top end shape of the pattern is a convex shape and a radius of curvature of the top end portion is 100 μm or less, (3) a top end shape is a concave shape and consists of straight lines and has three corner portions at a top end side, and both angles of the corner portions on both sides of the top end shape are set to 45 degree or more, (4) a top end shape is a concave shape and consists of curved lines, and (5) a width of a top end portion is 25 μm or less.

Accordingly, the peeling of the polysilicon film caused by the CW laser irradiation can be suppressed, and the polysilicon film formed of the silicon crystal whose grain size is large and uniform can be formed. As a result, the thin film transistors that can execute the high-speed operation and have the uniform characteristics can be formed, the higher performance of the liquid crystal display device, the organic EL display device, etc. can be achieved, and also the manufacturing yield can be improved.

The reason that the peeling can be suppressed when the shape of the amorphous silicon film before the CW laser irradiation is set as above does not become apparent. But it may be considered that the reason is such that, if the top end shape of the pattern is a convex shape, the growth of the crystal starts from one spot, whereas if the top end shape of the pattern is a rectangle, the growth of the crystal starts from plural spots, and the large stress is generated in portions at which these grown crystals are brought into contact with each other, thus peeling is generated.

BRIEF DESCRIPTION OF THE DRAWINGS

FIG. 1 is a plan view (No.1) showing a pattern shape of an amorphous silicon film;

FIG. 2 is a plan view (No.2) showing a pattern shape of an amorphous silicon film;

FIG. 3 is a plan view (No.3) showing a pattern shape of an amorphous silicon film;

FIG. 4 is a plan view (No.4) showing a pattern shape of an amorphous silicon film;

FIG. 5 is a plan view (No.5) showing a pattern shape of an amorphous silicon film;

DESCRIPTION OF THE PREFERRED EMBODIMENTS

The present invention will be explained in more detail hereinafter.

The inventors of the present invention formed the amorphous silicon film of a thickness of about 100 nm on the glass substrate by the plasma CVD method, then applied the annealing process (hydrogen degasing process) to anneal them at the temperature of 450° C. for 2 hours, and then patterned on the amorphous silicon film into the patterns shown in FIG. 1 to FIG. 5 by the photolithography method.

Then, the inventors irradiated the CW laser onto the amorphous silicon film to form the polysilicon film. The semiconductor-excited (LD-excited) solid-state laser (DPSS laser) is employed as the CW laser. The wavelength of the solid-state laser is 532 nm and the output is 10 W. Also, a width of the CW laser irradiation region is 20 to 40 $\mu$m and a length is 400 $\mu$m. The laser irradiation region was scanned in its width direction (short-axis direction). The scanning direction is the direction indicated by an arrow in FIG. 1 to FIG. 5.

The inventors examined the appearance number of peelings in each pattern for 2000 test pieces respectively. As a result, it is found that the appearance number of peelings is largely different depending on the width and the top end shape of the pattern. The generation number of peelings every width of the pattern is shown in the following.

Width 30 $\mu$m

The amorphous silicon film was formed on the glass substrate, and then the patterns which a width (width of the rectangle in which the pattern is inscribed) is 30 $\mu$m and which a length is 200 $\mu$m, as shown in FIG. 1 to FIG. 5, were formed by etching the amorphous silicon film by the photolithography method.

Figure 6:
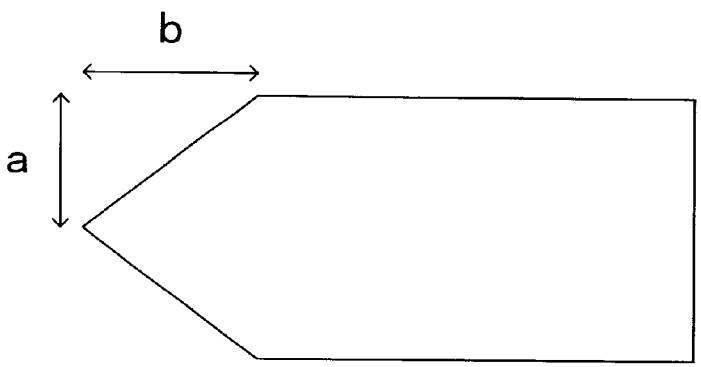
FIG. 6 is a plan view (No.1) showing a shape and a size of a pattern top end portion of the amorphous silicon film.

A top end portion of a pattern A1 is a convex shape (V-shape), and a value a shown in FIG. 6 is 15 $\mu$m and a value b is 12 $\mu$m. Also, a top end portion of a pattern B1 is a convex shape (V-shape), and the value a shown in FIG. 6 is 15 $\mu$m and the value b is 30 $\mu$m.

Figure 7:
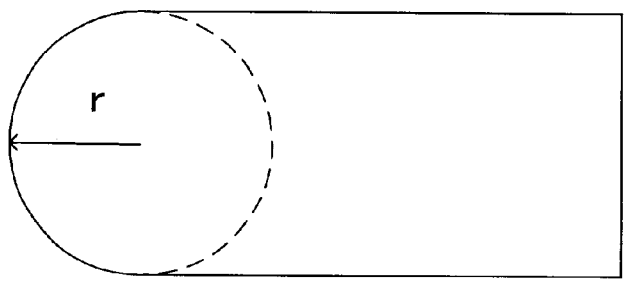
FIG. 7 is a plan view (No.2) showing a shape and a size of a pattern top end portion of the amorphous silicon film.
Figure 8:
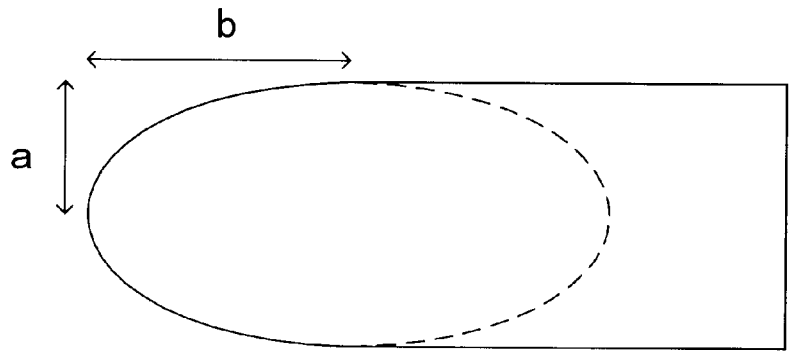
FIG. 8 is a plan view (No.3) showing a shape and a size of a pattern top end portion of the amorphous silicon film.

A top end portion of a pattern C1 is a convex shape (semicircle), and a value of a radius of curvature r shown in FIG. 7 is 15 $\mu$m. Also, a top end portion of a pattern D1 is a convex shape (semi-ellipse), and a value of a minor-axis radius a shown in FIG. 8 is 15 $\mu$m, a value of a major-axis radius b is 50 $\mu$m, and a value of a radius of curvature ($a^2/b$) of the top end portion is 4.5 $\mu$m.

Figure 9:
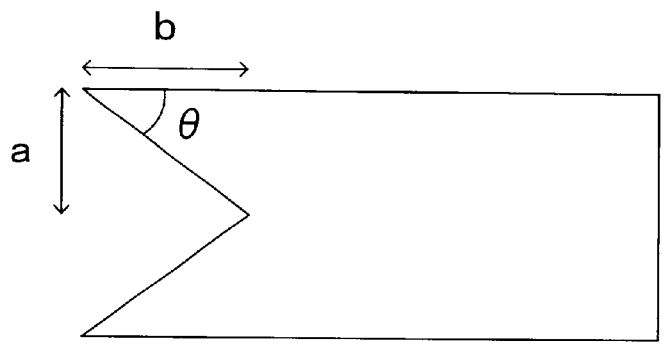
FIG. 9 is a plan view (No.4) showing a shape and a size of a pattern top end portion of the amorphous silicon film.

A top end portion of a pattern E1 is a concave shape (V-shape), and a value a shown in FIG. 9 is 15 $\mu$m, a value b is 6 $\mu$m, and an angle $\theta$ is 68.2 degree. Also, a top end portion of a pattern F1 is a concave shape (V-shape), and the value a shown in FIG. 9 is 15 $\mu$m, the value b is 18 $\mu$m, and an angle $\theta$ is 40 degree.

Figure 10:
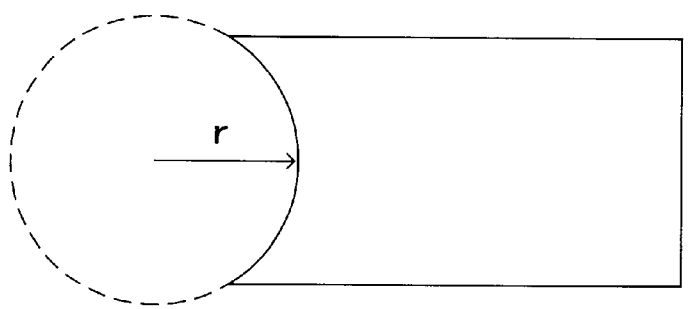
FIG. 10 is a plan view (No.5) showing a shape and a size of a pattern top end portion of the amorphous silicon film.

A top end portion of a pattern G1 is a concave shape (circular arc), and a value of a radius of curvature r shown in FIG. 10 is 18 $\mu$m. Also, a top end portion of a pattern H1 is a concave shape (semicircle), and a value of a radius of curvature r is 15 $\mu$m.

Figure 11:
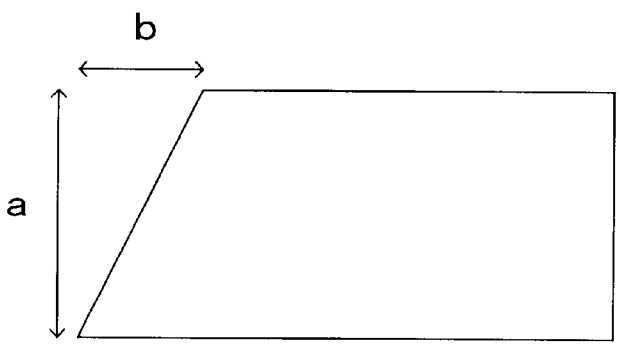
FIG. 11 is a plan view (No.6) showing a shape and a size of a pattern top end portion of the amorphous silicon film.

A top end portion of a pattern I1 is a convex shape (slant shape), and a value a shown in FIG. 11 is 30 $\mu$m and a value b is 10 $\mu$m. Also, a top end portion of a pattern K1 is a convex shape (slant shape), and the value a shown in FIG. 11 is 30 μm and the value b is 40 μm.

Figure 12:
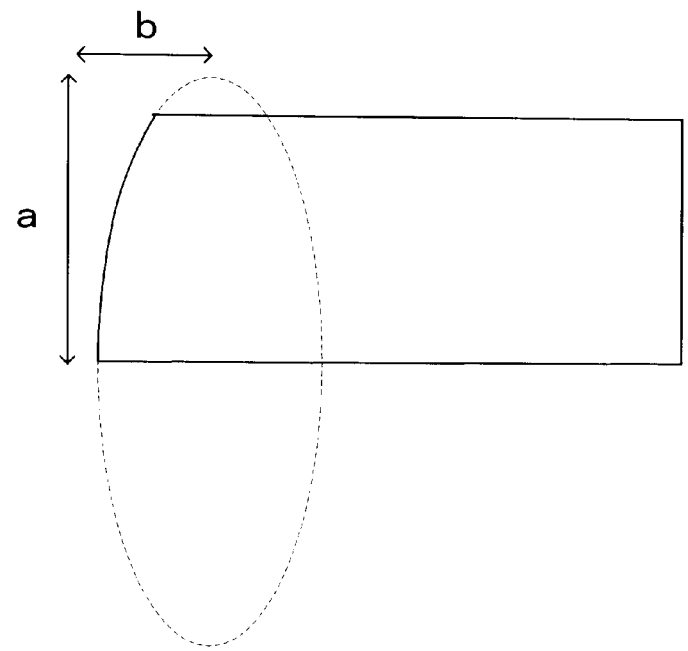
FIG. 12 is a plan view (No.7) showing a shape and a size of a pattern top end portion of the amorphous silicon film.
Figure 13:
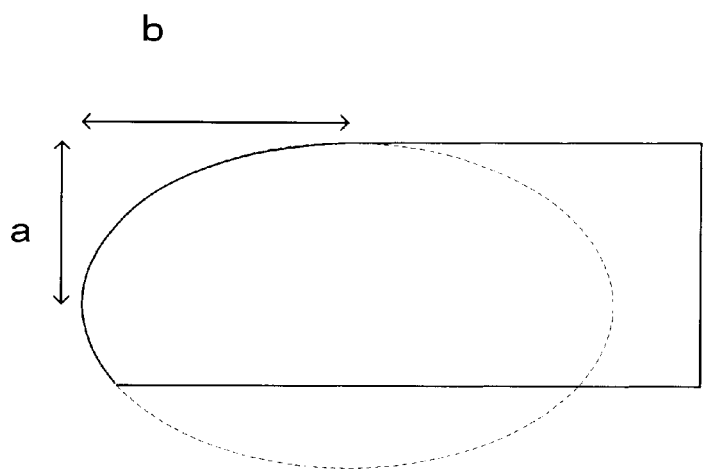
FIG. 13 is a plan view (No.8) showing a shape and a size of a pattern top end portion of the amorphous silicon film.

A top end portion of a pattern J1 is a convex shape (curved line along a circumference of the ellipse), and a value of a major-axis radius a shown in FIG. 12 is 26.5 μm, a value of a minor-axis radius b is 17 μm, and a value of a radius of curvature ($a^2/b$) of the top end portion is 41.3 μm. Also, a top end portion of a pattern L1 is a convex shape (curved line along a circumference of the ellipse), and a value of a minor-axis radius a shown in FIG. 13 is 20 μm, a value of a major-axis radius b is 40 μm, and a value of a radius of curvature ($a^2/b$) of the top end portion is 10 μm.

Figure 14:
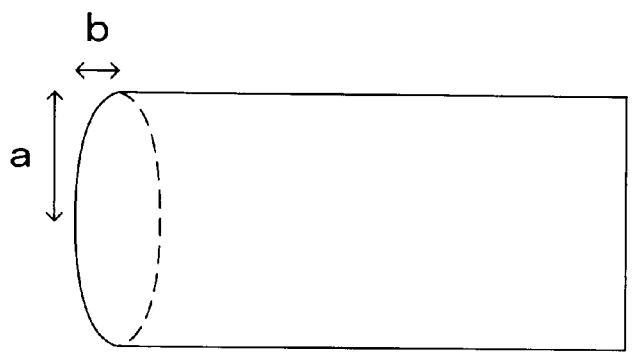
FIG. 14 is a plan view (No.9) showing a shape and a size of a pattern top end portion of the amorphous silicon film.

A top end portion of a pattern M1 is a convex shape (semi-ellipse), and a value of a major-axis radius a shown in FIG. 14 is 15 μm, a value of a minor-axis radius b is 5 μm, and a value of a radius of curvature ($a^2/b$) of the top end portion is 45 μm.

Figure 15:
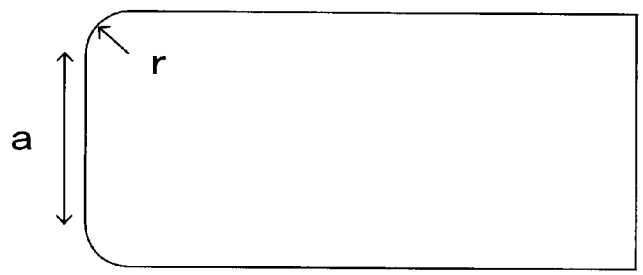
FIG. 15 is a plan view (No.10) showing a shape and a size of a pattern top end portion of the amorphous silicon film.

A top end portion of a pattern N1 is a pattern that has a straight line being parallel with the major-axis direction of the laser irradiation region at its top end portion, and a value of a radius of curvature r of a corner portion shown in FIG. 15 is 5 μm, and a value of a straight portion a is 20 μm.

A top end portion of a pattern O1 is a convex shape (rhombus). Also, a top end portion of a pattern P1 is a convex shape (ellipse).

Figure 16:
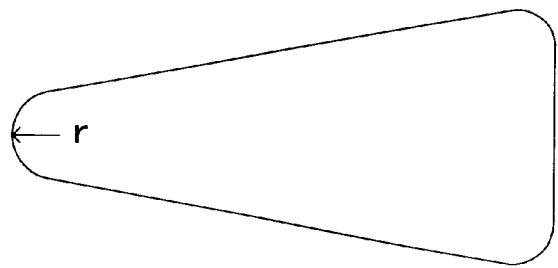
FIG. 16 is a plan view (No.11) showing a shape and a size of a pattern top end portion of the amorphous silicon film.

A pattern Q1 is an almost trapezoid pattern. When a width of the pattern Q1 is 30 μm, there is no straight line being parallel with the major-axis direction of the laser irradiation region at its top end portion, and the pattern Q1 has a shape shown in FIG. 16 and a value of a radius of curvature r is 5 μm.

Figure 17:
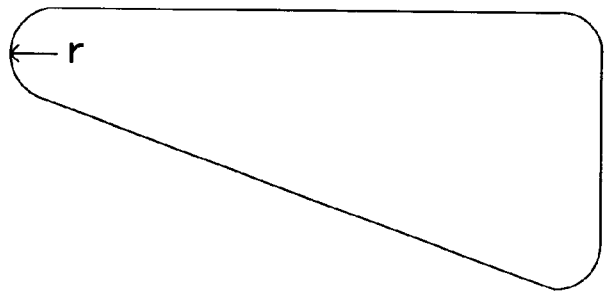
FIG. 17 is a plan view (No.12) showing a shape and a size of a pattern top end portion of the amorphous silicon film.

A top end portion of a pattern R1 is a convex shape (almost right-angled triangle), and a value of a radius of curvature r of the top end portion shown in FIG. 17 is 5 μm. A pattern V1 is a rectangular pattern whose width is 30 μm and whose length is 200 μm.

Irradiating the CW laser onto the amorphous silicon films of these patterns forms the polysilicon film. Then, the appearance number of peelings for 2000 test pieces 5 was examined. The results are shown in following Table 1. In Table 1, evaluation results are given together. The case where the number of peelings is 10 or less is evaluated good (○) and the case where the number of peelings is 11 or more is evaluated bad (X).

TABLE 1

(Width: 30 μm)

| Shape | Number of peeled sheets | Evaluation |
|---|---|---|
| A1 | 4 | ○ |
| B1 | 0 | ○ |
| C1 | 0 | ○ |
| D1 | 1 | ○ |
| E1 | 0 | ○ |
| F1 | 528 | X |
| G1 | 9 | ○ |
| H1 | 2 | ○ |
| I1 | 1 | ○ |
| J1 | 0 | ○ |
| K1 | 0 | ○ |
| L1 | 0 | ○ |
| M1 | 2 | ○ |
| N1 | 5 | ○ |
| O1 | 0 | ○ |
| P1 | 0 | ○ |
| Q1 | 0 | ○ |

TABLE 1-continued (Width: 30 μm)

| Shape | Number of peeled sheets | Evaluation |
|---|---|---|
| R1 | 0 | ○ |
| V1 | 11 | X |

As apparent from this Table 1, when the pattern has a width of 30 μm, 528 peelings occur in the pattern F1 whose top end shape is concave and consists of straight lines, which has three corner portions at its top end side, and both angles θ of the corner portions on both sides of which are below 45 degree. Also, 11 peelings occur in the pattern V1 that is the rectangular shape.

Meanwhile, in the patterns A1, B1, C1, D1, I1, J1, K1, L1, M1, O1, P1, Q1, R1 whose top end shape is the convex shape, the pattern E1 whose top end shape is concave and consists of the straight lines, which has three corner portions at its top end side, and both angles of the corner portions on both sides of which are 45 degree or more, the patterns G1, H1 whose top end shape is concave and consists of the curved line, and the pattern N1 a length of the straight line of the top end portion of which is 25 μm or less, the appearance number of peelings is 9 or less.

Width 50 μm

The amorphous silicon film was formed on the glass substrate, and then the patterns which a width (width of the rectangle in which the pattern is inscribed) is 50 μm and which a length is 200 μm, as shown in FIG. 1 to FIG. 5, were formed by etching the amorphous silicon film by the photolithography method.

A top end portion of a pattern A1 is a convex shape (V-shape), and a value a shown in FIG. 6 is 25 μm and a value b is 20 μm. Also, a top end portion of a pattern B1 is a convex shape (V-shape), and the value a shown in FIG. 6 is 25 μm and the value b is 50 μm.

A top end portion of a pattern C1 is a convex shape (semicircle), and a value of a radius of curvature r shown in FIG. 7 is 25 μm. Also, a top end portion of a pattern D1 is a convex shape (semi-ellipse), and a value of a minor-axis radius a shown in FIG. 8 is 25 μm, a value of a major-axis radius b is 50 μm, and a value of a radius of curvature ($a^2/b$) of the top end portion is 12.5 μm.

A top end portion of a pattern E1 is a concave shape (V-shape), and a value a shown in FIG. 9 is 25 μm, a value b is 10 μm, and an angle θ is 68.2 degree. Also, a top end portion of a pattern F1 is a concave shape (V-shape), and the value a shown in FIG. 9 is 25 μm, the value b is 30 μm, and an angle θ is 39.8 degree.

A top end portion of a pattern G1 is a concave shape (circular arc), and a value of a radius of curvature r shown in FIG. 10 is 47 μm. Also, a top end portion of a pattern H1 is a concave shape (semicircle), and a value of a radius of curvature r is 25 μm.

A top end portion of a pattern I1 is a convex shape (slant shape), and a value a shown in FIG. 11 is 50 μm and a value b is 10 μm. Also, a top end portion of a pattern K1 is a convex shape (slant shape), and the value a shown in FIG. 11 is 50 μm and the value b is 40 μm.

A top end portion of a pattern J1 is a convex shape (curved line along a circumference of the ellipse), and a value of a major-axis radius a shown in FIG. 12 is 47.5 μm, a value of a minor-axis radius b is 27.5 μm, and a value of a radius of curvature ($a^2/b$) of the top end portion is 82 μm. Also, a top end portion of a pattern L1 is a convex shape (curved line along a circumference of the ellipse), and a value of a minor-axis radius a shown in FIG. 13 is 32.5 μm, a value of a major-axis radius b is 40 μm, and a value of a radius of curvature ($a^2/b$) of the top end portion is 26.4 μm.

A top end portion of a pattern M1 is a convex shape (semi-ellipse), and a value of a major-axis radius a shown in FIG. 14 is 25 μm, a value of a minor-axis radius b is 5 μm, and a value of a radius of curvature ($a^2/b$) of the top end portion is 125 μm.

A top end portion of a pattern N1 is a pattern that has a straight line being parallel with the major-axis direction of the laser irradiation region at its top end portion, and a value of a radius of curvature r of a corner portion shown in FIG. 15 is 5 μm, and a value of a straight portion a is 40 μm.

A top end portion of a pattern O1 is a convex shape (rhombus). Also, a top end portion of a pattern P1 is a convex shape (ellipse).

Figure 18:
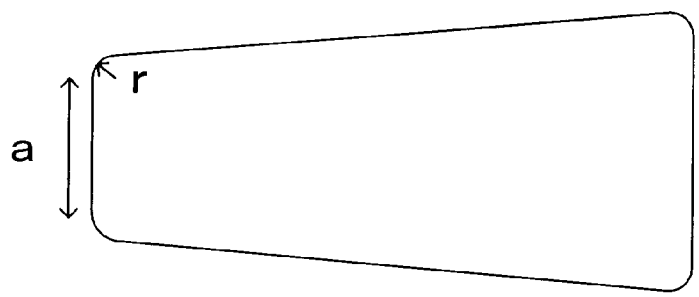
FIG. 18 is a plan view (No.13) showing a shape and a size of a pattern top end portion of the amorphous silicon film.

A pattern Q1 is a shape that has a straight line being parallel with the major-axis direction of the laser irradiation region (almost trapezoid pattern) at its top end portion. A value of a radius of curvature r shown in FIG. 18 is 5 μm, and a length a of the straight line portion is 20 μm.

A top end portion of a pattern R1 is a convex shape (almost right-angled triangle), and a value of a radius of curvature r of the top end portion shown in FIG. 17 is 5 μm. A pattern V1 is a rectangular pattern whose width is 50 μm and whose length is 200 μm.

Irradiating the CW laser onto the amorphous silicon films of these patterns forms the polysilicon film. Then, the generation number of peelings for 2000 test pieces was examined. The results are shown in following Table 2. In Table 2, evaluation results are given together. The case where the number of peelings is 10 or less is evaluated good (○) and the case where the number of peelings is 11 or more is evaluated bad (X).

TABLE 2

(Width: 50 μm)

| Shape | Number of peeled sheets | Evaluation |
|---|---|---|
| A1 | 4 | ○ |
| B1 | 0 | ○ |
| C1 | 0 | ○ |
| D1 | 1 | ○ |
| E1 | 0 | ○ |
| F1 | 467 | X |
| G1 | 4 | ○ |
| H1 | 5 | ○ |
| I1 | 2 | ○ |
| J1 | 3 | ○ |
| K1 | 1 | ○ |
| L1 | 2 | ○ |
| M1 | 17 | ○ |
| N1 | 89 | ○ |
| O1 | 0 | ○ |
| P1 | 0 | ○ |
| Q1 | 3 | ○ |
| R1 | 0 | ○ |
| V1 | 78 | X |

As apparent from this Table 2, when the pattern has a width of 50 μm, 467 peelings occur in the pattern F1 whose top end shape is concave and consists of straight lines, which has three corner portions at its top end side, and both angles θ of the corner portions on both sides of which are below 45 degree. Also, 78 peelings occur in the pattern V1 that is the rectangular shape. In addition, 17 peelings occur in the pattern M1 whose top end shape is convex but a radius of curvature of which is larger than 100 μm, and 89 peelings occur in the pattern N1 a width of the top end portion of which is larger than 25 μm.

Meanwhile, in the patterns A1, B1, I1, K1, O1 whose top end shape is the convex shape and consists of the straight line or straight lines, the patterns C1, D1, J1, L1, P1, R1 whose top end shape is the convex shape and a radius of curvature of the top end portion of which is 100 μm or less, the pattern E1 whose top end shape is concave and consists of the straight lines, which has three corner portions at its top end side, and both angles of the corner portions on both sides of which are 45 degree or more, the patterns G1, H1 whose top end shape is concave and consists of the curved line, and the pattern Q1 a length of the straight line of the top end portion of which is 25 μm or less, the appearance number of peelings is 5 or less.

Width 70 μm

The amorphous silicon film was formed on the glass substrate, and then the patterns which a width (width of the rectangle in which the pattern is inscribed) is 70 μm and which a length is 200 μm, as shown in FIG. 1 to FIG. 5, were formed by etching the amorphous silicon film by the photolithography method.

A top end portion of a pattern A1 is a convex shape (V-shape), and a value a shown in FIG. 6 is 35 μm and a value b is 28 μm. Also, a top end portion of a pattern B1 is a convex shape (V-shape), and the value a shown in FIG. 6 is 35 μm and the value b is 70 μm.

A top end portion of a pattern C1 is a convex shape (semicircle), and a value of a radius of curvature r shown in FIG. 7 is 35 μm. Also, a top end portion of a pattern D1 is a convex shape (semi-ellipse), and a value of a minor-axis radius a shown in FIG. 8 is 35 μm, a value of a major-axis radius b is 50 μm, and a value of a radius of curvature ($a^2/b$) of the top end portion is 24.5 μm.

A top end portion of a pattern E1 is a concave shape (V-shape), and a value a shown in FIG. 9 is 35 μm, a value b is 14 μm, and an angle θ is 68.2 degree. Also, a top end portion of a pattern F1 is a concave shape (V-shape), and the value a shown in FIG. 9 is 35 μm, the value b is 42 μm, and an angle θ is 39.8 degree.

A top end portion of a pattern G1 is a concave shape (circular arc), and a value of a radius of curvature r shown in FIG. 10 is 40 μm. Also, a top end portion of a pattern H1 is a concave shape (semicircle), and a value of a radius of curvature r is 35 μm.

A top end portion of a pattern I1 is a convex shape (slant shape), and a value a shown in FIG. 11 is 70 μm and a value b is 10 μm. Also, a top end portion of a pattern K1 is a convex shape (slant shape), and the value a shown in FIG. 11 is 70 μm and the value b is 50 μm.

A top end portion of a pattern J1 is a convex shape (curved line along the circumference of the ellipse), and a value of a major-axis radius a shown in FIG. 12 is 55 μm, a value of a minor-axis radius b is 36.5 μm, and a value of a radius of curvature ($a^2/b$) of the top end portion is 82.9 μm. Also, a top end portion of a pattern L1 is a convex shape (curved line along the circumference of the ellipse), and a value of a minor-axis radius a shown in FIG. 13 is 44 μm, a value of a major-axis radius b is 50.5 μm, and a value of a radius of curvature ($a^2/b$) of the top end portion is 38.3 μm.

A top end portion of a pattern M1 is a convex shape (semi-ellipse), and a value of a major-axis radius a shown in FIG. 14 is 35 μm, a value of a minor-axis radius b is 5 μm, and a value of a radius of curvature ($a^2/b$) of the top end portion is 245 μm.

A top end portion of a pattern N1 is a pattern that has a straight line being parallel with the major-axis direction of the laser irradiation region at its top end portion, and a value r shown in FIG. 15 is 5 μm, and a value of a straight portion a is 60 μm.

A top end portion of a pattern O1 is a convex shape (rhombus). Also, a top end portion of a pattern P1 is a convex shape (ellipse).

A pattern Q1 is a shape that has a straight line being parallel with the major-axis direction of the laser irradiation region (almost trapezoid pattern) at its top end portion. A value of a radius of curvature r of the corner portion shown in FIG. 18 is 5 μm, and a length a of the straight line portion is 40 μm.

A top end portion of a pattern R1 is a convex shape (almost right triangle), and a value of a radius of curvature r of the top end portion shown in FIG. 17 is 5 μm. A pattern V1 is a rectangular pattern whose width is 70 μm and whose length is 200 μm.

Irradiating the CW laser onto the amorphous silicon films of these patterns forms the polysilicon film. Then, the appearance number of peelings for 2000 test pieces was examined. The results are shown in following Table 3. In Table 3, evaluation results are given together. The case where the number of peelings is 10 or less is evaluated good (○) and the case where the number of peelings is 11 or more is evaluated bad (X).

TABLE 3

(Width: 70 μm)

| Shape | Number of peeled sheets | Evaluation |
|---|---|---|
| A1 | 1 | ○ |
| B1 | 0 | ○ |
| C1 | 6 | ○ |
| D1 | 1 | ○ |
| E1 | 2 | ○ |
| F1 | 435 | X |
| G1 | 6 | ○ |
| H1 | 5 | ○ |
| I1 | 7 | ○ |
| J1 | 9 | ○ |
| K1 | 0 | ○ |
| L1 | 1 | ○ |
| M1 | 31 | X |
| N1 | 110 | X |
| O1 | 0 | ○ |
| P1 | 0 | ○ |
| Q1 | 105 | X |
| R1 | 0 | ○ |
| V1 | 116 | X |

As apparent from this Table 3, when the pattern has a width of 70 μm, 435 peelings occur in the pattern F1 whose top end shape is concave and consists of straight lines, which has three corner portions at its top end side, and both angles θ of the corner portions on both sides of which are below 45 degree. Also, 116 peelings occur in the pattern V1 that is the rectangular shape. In addition, 31 peelings occur in the pattern M1 whose top end shape is convex but a radius of curvature of which is larger than 100 μm, and 10 and 105 peelings occur in the patterns N1 and Q1, a width of the top end portion of which is larger than 25 μm, respectively.

Meanwhile, in the patterns A1, B1, I1, K1, O1 whose top end shape is the convex shape and consists of the straight line or straight lines, the patterns C1, D1, J1, L1, P1, R1 whose top end shape is the convex shape and a radius of curvature of the top end portion of which is 100 μm or less, the pattern E1 whose top end shape is concave and consists of the straight lines, which has three corner portions at its top end side, and both angles of the corner portions on both sides of which are 45 degree or more, and the patterns G1, H1 whose top end shape is concave and consists of the curved line, the appearance number of peelings is 9 or less.

Figure 19:
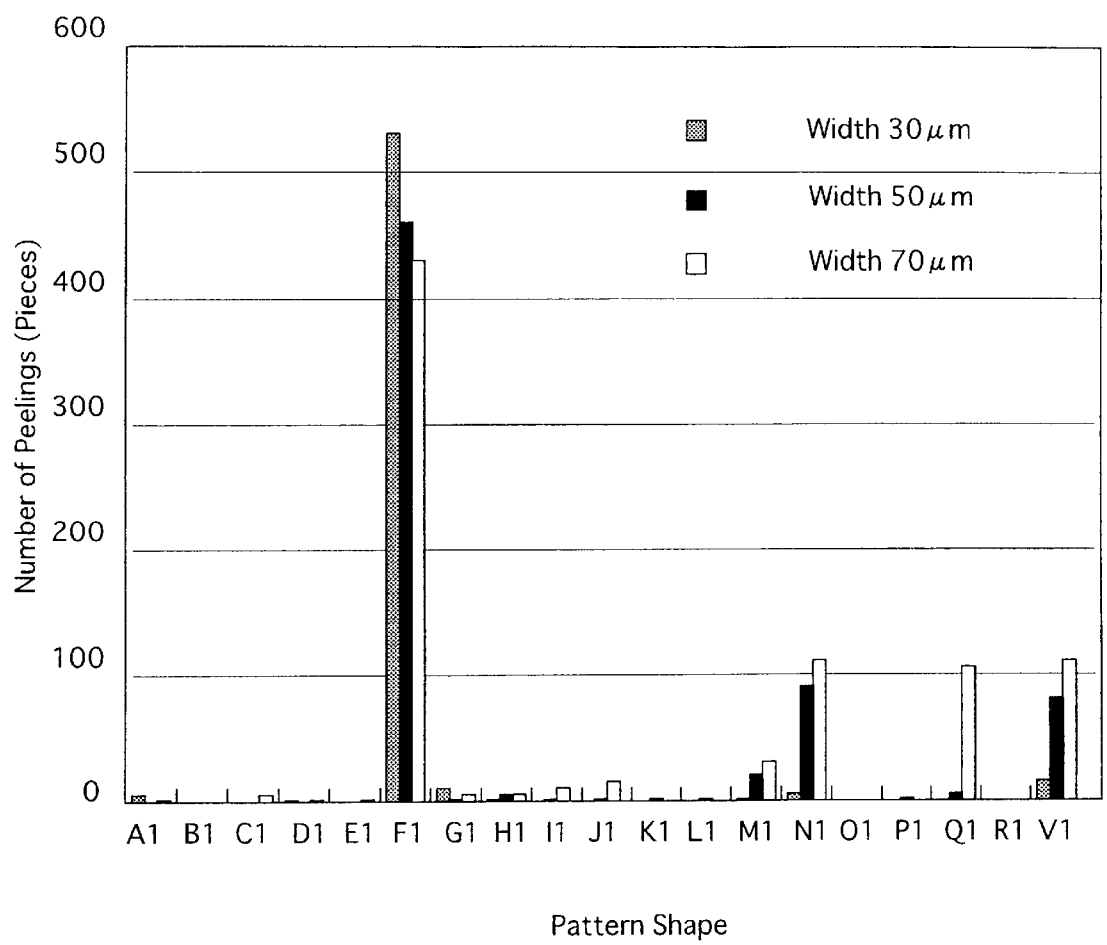
FIG. 19 is a graph showing the appearance number of peelings every pattern shape.

Examined results of the number of peelings when the width of the pattern is set to 30 μm, 50 μm, and 70 μm respectively are shown as a bar graph in FIG. 19.

Shape of the Rear End Portion of the Pattern

If the rear edge portion of the island-like amorphous silicon film is the straight line that is parallel with the major-axis direction of the laser irradiation region, there is the problem such that a raised portion of the polysilicon is generated at the rear edge portion of the pattern when irradiating the CW laser forms the polysilicon film. If such raised portion is generated, the etching residue is produced and acts as the cause that brings about the failure such as the wiring disconnection, etc. when the polysilicon film is etched.

Figure 20:
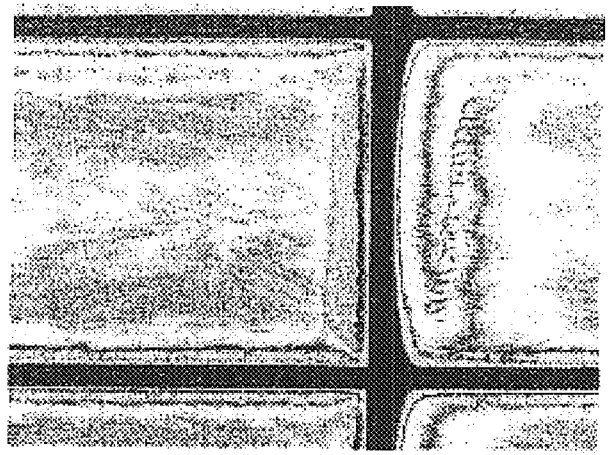
FIG. 20 is a view showing a microscopic photograph of the polysilicon film after the CW laser is irradiated (before the etching)
Figure 21:
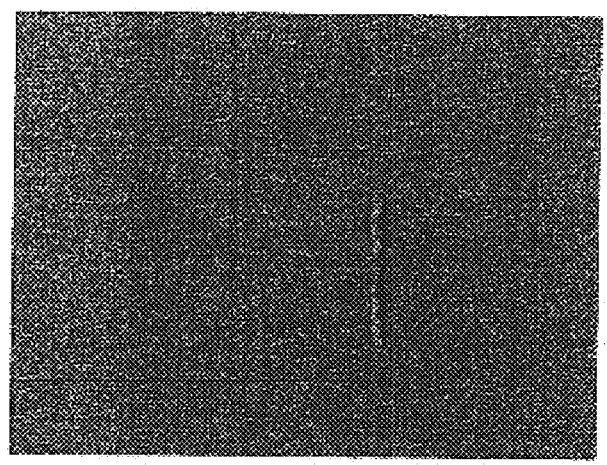
FIG. 21 is a view showing another microscopic photographs after the polysilicon film is etched.

FIG. 20 is a view showing a microscopic photograph of the polysilicon film after the CW laser is irradiated (before the etching), and FIG. 21 is a view showing another microscopic photograph after the polysilicon film is etched. It can be seen from these FIG. 20 and FIG. 21 that the raised portion is generated at the rear edge portion of the pattern and such raised portion cannot be perfectly removed after the etching.

Figure 22:
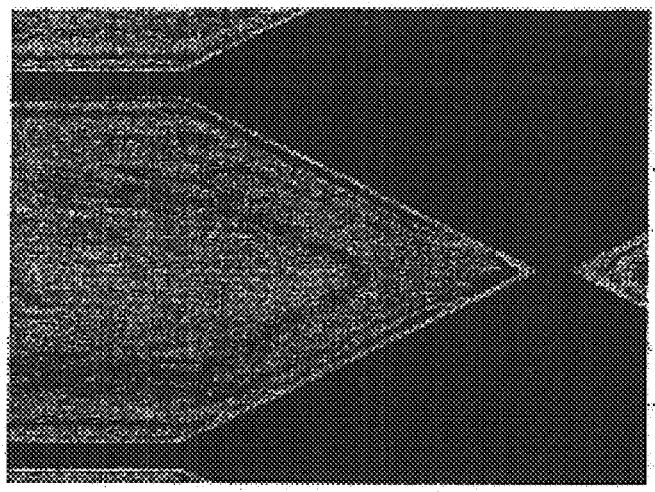
FIG. 22 is a view showing an example that a rear end portion of the pattern is formed into a convex shape.
Figure 23:
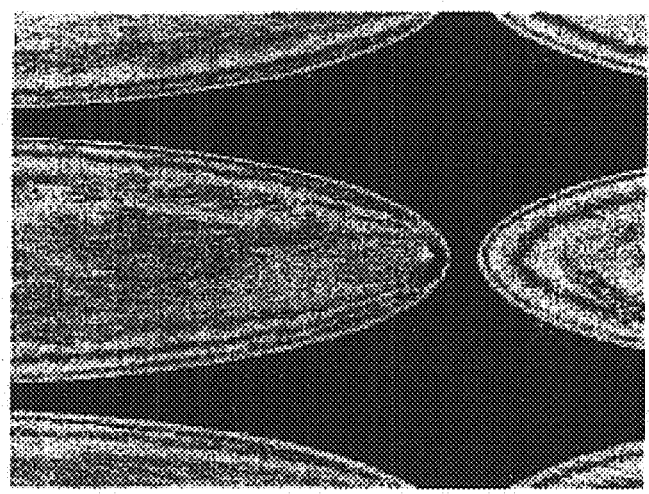
FIG. 23 is a view showing another example that the rear end portion of the pattern is formed into another convex shape.

As the result of various examinations/studies made by the inventors of the present invention to suppress the raised portion at the rear edge portion of the pattern, it is found that the raised portion can be made small by forming the rear edge portion of the pattern into the convex shape. For example, if the end portion is formed into the triangular shape shown in FIG. 22 or the elliptic shape shown in FIG. 23, the raised portion becomes a spot. Accordingly, the residue after the etching can be reduced and the disconnection can be prevented.

TFT Manufacturing Method

The example in which the present invention is applied to the TFT manufacturing method will be explained with reference to FIGS. 24A to 24I hereinafter.

Figure 24A:
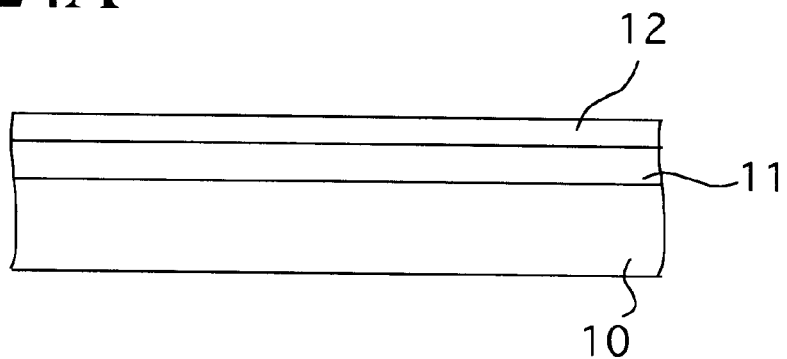
FIGS. 24A to 24I are sectional views showing an example that the present invention is applied to the TFT manufacturing method.

First, as shown in FIG. 24A, the SiO₂ film 11 of about 400 nm thickness is formed as the buffer layer on the glass substrate 10, or the SiN film of about 50 nm thickness and the SiO₂ film of about 200 nm thickness are formed as the buffer layer. Then, the amorphous silicon film 12 of 100 nm thickness is formed on the SiO₂ film 11 by the plasma CVD method. Then, the resultant structure is annealed at the temperature of 450° C. for 2 hours as the hydrogen degassing process.

Figure 24B:
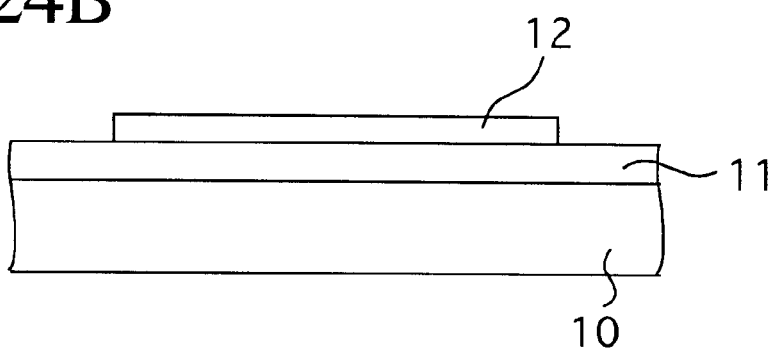
Figure 25A:
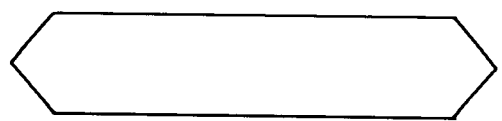
FIGS. 25A and 25B are plan views showing an example of the pattern of the amorphous silicon film in manufacturing the TFT respectively.
Figure 25B:

Then, as shown in FIG. 24B, the amorphous silicon film 12 is patterned into the island-like shape by the photolithography method. At this time, the shape of the amorphous silicon film 12 is formed into the shape in which the peeling or the raised portion as described above is difficult to generate. More particularly, for example, the hexagon, that is long and narrow in the laser scanning direction, shown in FIG. 25A and the ellipse shown in FIG. 25B may be employed.

Figure 24C:
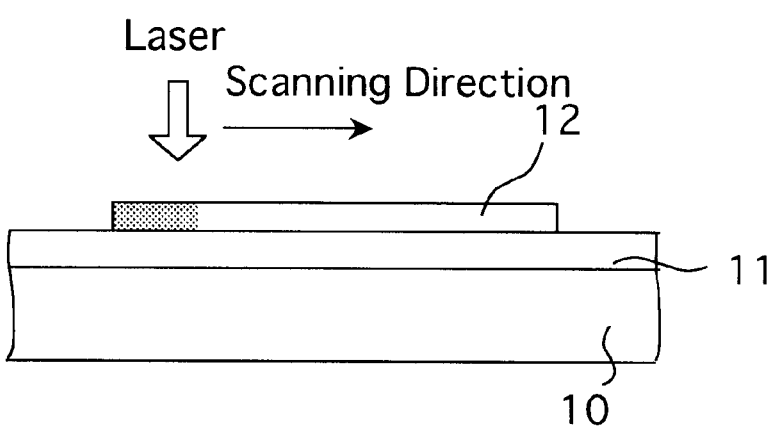

Then, as shown in FIG. 24C, while irradiating the laser beam onto the amorphous silicon film 12 by the CW laser, the laser irradiation region is scanned continuously in one direction. The semiconductor-excited (LD-excited) solid-state laser (DPSS laser) is employed as the CW laser. The laser wavelength is 532 nm and the output is 10 W. The laser beam is shaped into the line of 400 μm×20 to 40 μm (long and narrow rectangle), for example, and is scanned in the short-axis direction. The scanning speed is 20 cm/sec.

In this case, the laser may be irradiated onto the amorphous silicon film 12 from the backside of the glass substrate 10. And it is possible to be irradiated from the front side of the amorphous silicon. Also, the laser scanning may be executed plural times. In such case, it is preferable that the energy should be enhanced sequentially.

The silicon in the silicon film is polycrystallized by this CW laser irradiation and thus the polysilicon film is obtained. The silicon crystal in this polysilicon film is 10 to 100 times the size of the silicon crystal obtained by irradiation of the excimer laser pulse in the prior art, and becomes the streamlined crystal that is long and narrow in the laser scanning direction. The grain size of the crystal can be grown in 5 μm or more.

Figure 24D:
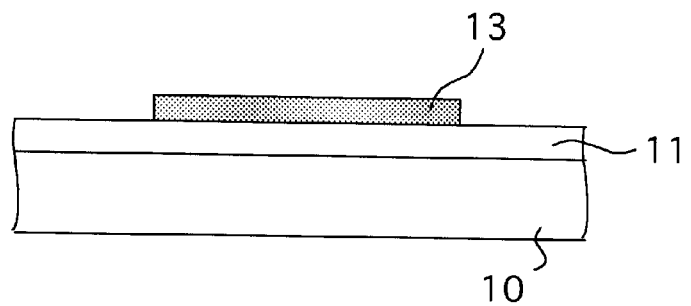
Figure 26:
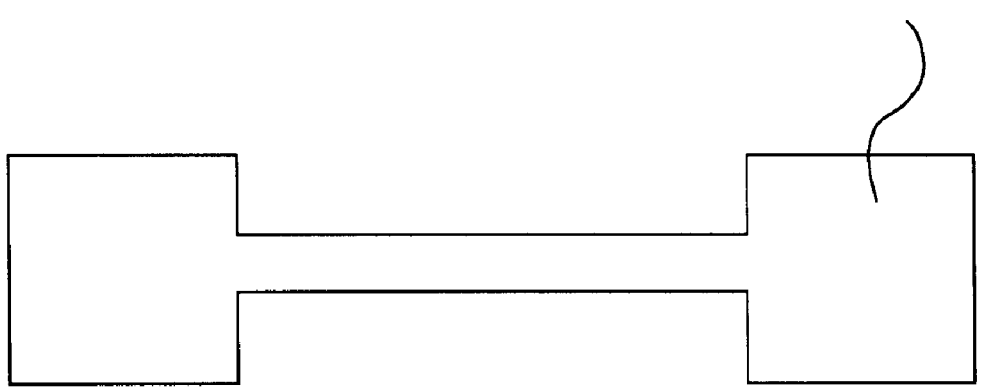
FIG. 26 is a plan view showing an example of the shape of the polysilicon film.

After this, as shown in FIG. 24D, the island-like silicon film is patterned into a desired TFT shape (for example, the shape shown in a plan view of FIG. 26). At this time, it is preferable that the long-axis direction of the crystal in the silicon film 13 should be set to the current flowing direction.

Figure 24E:
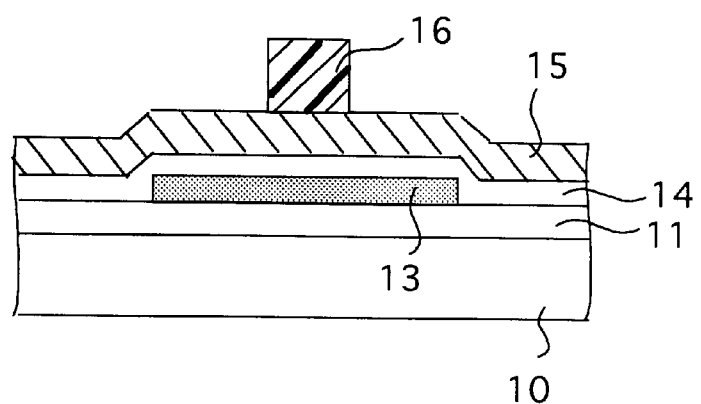

Then, as shown in FIG. 24E, the $SiO_2$ film 14 as the gate oxide film is formed a thickness of about 200 nm or less on the overall upper surface of the substrate 10. The polysilicon film 13 is covered with this $SiO_2$ film 14. Then, the conductive film 15 (for example, aluminum film) of 300 nm thickness is formed on the $SiO_2$ film 14. Then, the resist pattern 16 having a desired gate electrode shape is formed on the conductive film 15 by using the photoresist.

Figure 24F:
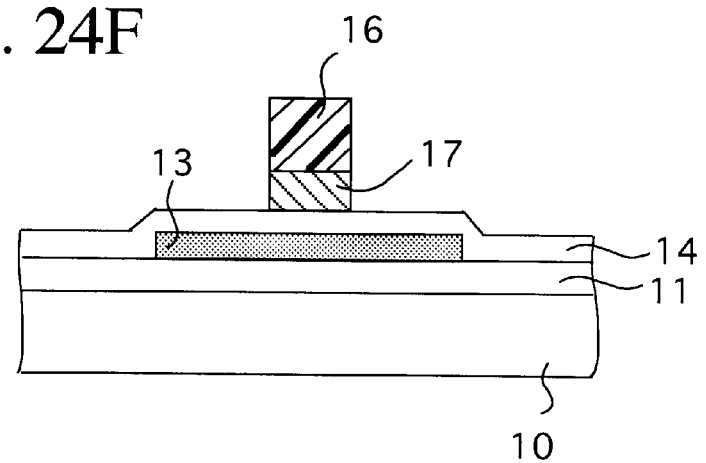

Then, as shown in FIG. 24F, etching the conductive film 15 while the resist pattern 16 is employed as a mask forms the gate electrode 17. Then, the resist pattern 16 is removed.

Figure 24G:
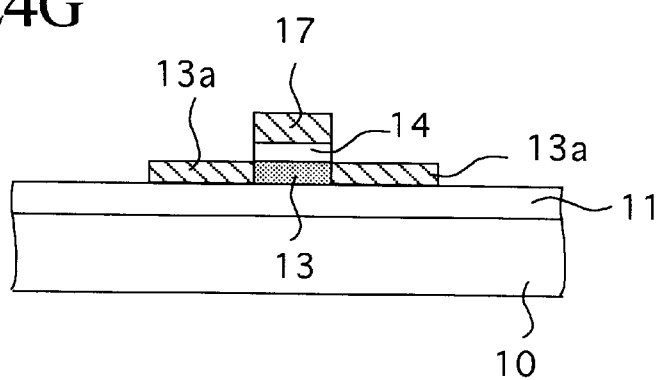

Then, as shown in FIG. 24G, the $SiO_2$ film 14 in regions except the region under the gate electrode 17 is removed by patterning the $SiO_2$ film 14 while using the gate electrode 17 as a mask. Then, source/drain regions 13a are formed, for example, by doping P (phosphorus) as the n-type impurity under the acceleration energy of 20 keV and the dose of $5 \times 10^{15}$ $cm^{-2}$ into the polysilicon film 13 while the gate electrode 17 is employed as a mask. In addition, the impurity in the source/drain regions 13a is activated by irradiating excimer laser for the source/drain regions 13a.

Figure 24H:
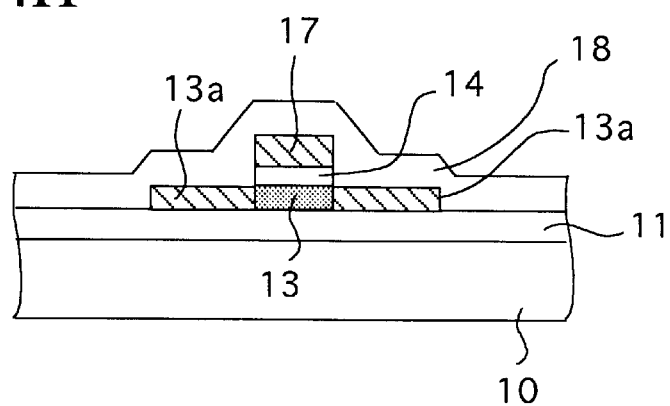

Then, as shown in FIG. 24H, the SiN film 18 of about 300 nm thickness is formed as the interlayer insulating film on the overall upper surface of the substrate 10 by the CVD method. It is preferable that $SiO_2$ (30 nm)/SiN (350 nm) is forming as the interlayer insulating film.

Figure 24I:
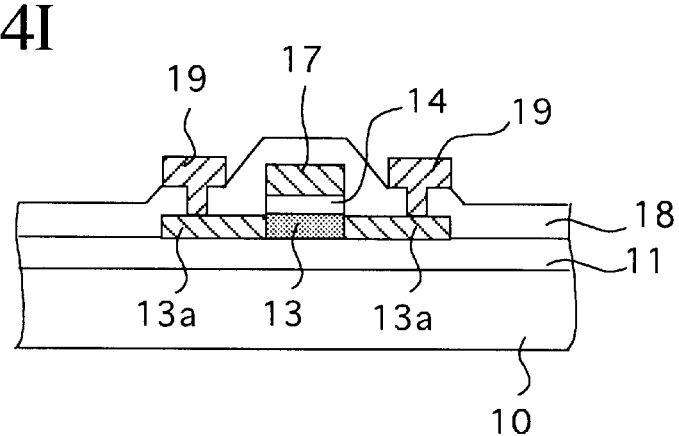

Then, the contact holes opened to the source/drain regions 13a are formed in the interlayer insulating film 18, and the metal film is formed on the overall upper surface of the substrate 10 by the sputter method. Then, as shown in FIG. 24I, patterning the metal film by means of the photolithography method forms source/drain electrodes 19. In this manner, the TFT is completed.

According to the present embodiment, the top end side and the rear end side of the amorphous silicon film in the laser scanning direction are patterned into the convex shape, and then the polysilicon film is formed from the amorphous silicon film by irradiating the CW laser. Therefore, the polysilicon film formed of the silicon crystal whose grain size is large and uniform can be formed and thus the peeling of the polysilicon film can be prevented in the laser-irradiating step. As a result, the higher-speed operation of the TFT employed in the liquid crystal display device or the organic EL display device can be achieved, and also the yield and the reliability of the device can be improved.

What is claimed is:

1. A polysilicon film forming method comprising the step of forming a polysilicon film by scanning a laser irradiation region while irradiating a continuous wave laser onto an amorphous silicon film formed into an island or ribbon-like shape on a substrate;

wherein a width of a rectangle in which the amorphous silicon film is inscribed is 30 μm or less, and a shape for suppressing peeling of the polysilicon film is formed to satisfy any one condition of (1) a top end shape of a pattern is a convex shape, (2) a top end shape is a concave shape and consists of straight lines and has three corner portions at a top end side, and both angles of the corner portions on both sides of the top end shape are set to 45 degree or more, (3) a top end shape is a concave shape and consists of curved lines, and (4) a width of a top end portion is 25 μm or less.

2. A polysilicon film forming method according to claim 1, further comprising the step of etching the polysilicon film into a predetermined shape after the polysilicon film is formed.

3. A polysilicon film forming method according to claim 1, wherein a rear end shape of the amorphous silicon film is formed into a convex shape.

4. A polysilicon film forming method comprising the step of forming a polysilicon film by scanning a laser irradiation region while irradiating a continuous wave laser onto an amorphous silicon film formed into an island or ribbon-like shape on a substrate;

wherein a width of a rectangle in which the amorphous silicon film is inscribed is in excess of 30 μm, and a shape for suppressing peeling of the polysilicon film is formed to satisfy any one condition of (1) a top end shape of a pattern is a convex shape and consists of straight lines, (2) a top end shape of the pattern is a convex shape and a radius of curvature of the top end portion is 100 μm or less, (3) a top end shape is a concave shape and consists of straight lines and has three corner portions at a top end side, and both angles of the corner portions on both sides of the top end shape are set to 45 degree or more, (4) a top end shape is a concave shape and consists of curved lines, and (5) a width of a top end portion is 25 μm or less.

5. A polysilicon film forming method according to claim 4, further comprising the step of etching the polysilicon film into a predetermined shape after the polysilicon film is formed.

6. A polysilicon film forming method according to claim 4, wherein a rear end shape of the amorphous silicon film is formed into a convex shape.

* * * * *